United States Patent [19]
Prakash et al.

[11] Patent Number: 5,717,730
[45] Date of Patent: Feb. 10, 1998

[54] MULTIPLE MONOLITHIC PHASE LOCKED LOOPS

[75] Inventors: Jaideep Prakash, Dallas; Robert Rudolf Rotzoll, Allen, both of Tex.

[73] Assignee: Microtune, Inc., Plano, Tex.

[21] Appl. No.: 577,653

[22] Filed: Dec. 22, 1995

[51] Int. Cl.$^6$ ............................................. H03D 3/24
[52] U.S. Cl. ........................ 375/376; 331/22; 331/47
[58] Field of Search ................................ 331/57, 17, 18, 331/22, 47, 175, 177 R; 375/376, 344; 332/127; 364/490; 455/260, 316

[56] References Cited

U.S. PATENT DOCUMENTS

| | | | |
|---|---|---|---|
| 4,114,110 | 9/1978 | Nossen | 331/2 |
| 4,368,437 | 1/1983 | Reuter | 331/2 |
| 4,388,597 | 6/1983 | Bickley et al. | 331/2 |
| 4,626,787 | 12/1986 | Mefford | 328/14 |
| 4,763,083 | 8/1988 | Edwards | 331/2 |
| 4,963,838 | 10/1990 | Hareyama | 331/2 |
| 5,075,639 | 12/1991 | Taya | 331/2 |
| 5,225,840 | 7/1993 | Hsu | 342/175 |
| 5,317,284 | 5/1994 | Yang | 331/2 |
| 5,332,978 | 7/1994 | Yabuki et al. | 331/2 |
| 5,373,256 | 12/1994 | Nicotra et al. | 331/2 |
| 5,374,902 | 12/1994 | Bradley | 331/2 |
| 5,463,351 | 10/1995 | Marko et al. | 331/1 A |
| 5,585,764 | 12/1996 | Ling | 331/57 |

*Primary Examiner*—Stephen Chin
*Assistant Examiner*—Joseph Roundtree
*Attorney, Agent, or Firm*—Fulbright & Jaworski L.L.P.

[57] ABSTRACT

A monolithic device is shown having a number of phase locked loops (PLLs) constructed thereon. At least one of the PLLs is constructed as a multiple loop having an output of one PLL loop tied back to the feedback path of the other loop of the pair. In this manner, tight resolution can be obtained in one loop while the bandwidth of that loop is coarse. The bandwidth of the second loop is tight, thereby giving good resolution to the first loop while still avoiding the problems inherent with noise injection locking from other PLLs on the same device.

9 Claims, 2 Drawing Sheets

MULTIPLE MONOLITHIC PHASE LOCKED LOOPS

TECHNICAL FIELD OF THE INVENTION

This invention relates to the design of Phase Locked Loops (PLL) and more specifically to the design of monolithic systems requiring multiple Phase-Locked Loops (PLL) on the same integrated circuit.

BACKGROUND OF THE INVENTION

Phase-Locked Loops are used in a variety of applications, such as clock recovery, frequency and phase modulation, and frequency synthesizers. Monolithic implementation of designs using PLLs currently exist. A concern of designs requiring multiple PLLs in monolithic form is coupling between the PLLs due to the sharing of a common substrate.

Of particular concern is the phenomenon of injection locking whereby a PLL can lock to the frequency of a periodic injected signal, such as could occur from a periodic induced noise signal. This is discussed in depth in the book "Phase-Locked Loop Circuit Design" by Don Walaver (Prentice Hall), which is incorporated by reference herein. The injected signal has the effect of modifying the bandwidth of the PLL by an offset related to the level of on-chip noise signal injection. Typically, in order to minimize the effect of this injection, the bandwidth of the PLL is made much larger than the offset due to injection.

An example of the problem with the prior art is shown in FIG. 2 where two PLLs 20 and 21 are used to perform frequency synthesis. For both PLLs existing on a common substrate, noise would couple in both directions between PLL 20 and PLL 21. The output frequency of the synthesizer is related to the input frequency by its divide ratio, N. The divide ratio also has the effect of reducing the bandwidth of the PLL by a factor of N. The implementation of a wide bandwidth system to avoid injection locking requires a large gain in the signal path from the phase detector to the VCO output. This is undesirable since this gain increases the level of phase noise at the VCO output due to noise coupling in this signal path.

Also, to implement a fine resolution synthesizer, a fine resolution reference frequency would be required at the input. However, this introduces the problem of spurious modulation of the output frequency due to the wide bandwidth of the PLL relative to the fine resolution input frequency.

Accordingly, it is desirable to provide more than one PLL on a single substrate, each having a bandwidth in keeping with the desired resolution in the PLL but without noise interference between the multiple PLLs.

SUMMARY OF THE INVENTION

The foregoing problems have been solved by the implementation of a dual-loop PLL consisting of a coarse resolution PLL and a fine resolution PLL. The design allows for the coarse PLL to provide a fine resolution frequency step based on the fine resolution PLL. The coarse resolution PLL is operated at a wide bandwidth to avoid injection locking due to on-chip noise coupling from other on-chip PLLs, while the fine resolution PLL operates at a lower operating frequency with a narrower bandwidth. This dual loop PLL effectively isolates the PLL output from variations caused by noise injection, while still allowing for a narrow bandwidth. Thus, fine frequency resolution can be achieved in a multiple monolithic PLL environment.

Thus, it is one technical advantage of this invention that two or more PLL can be constructed on the same substrate by designing at least one of the PLLs as a dual loop PLL, one of the pair having a coarse resolution while the other of the pair having a fine resolution.

It is a further technical advantage of this invention to provide a dual-loop PLL designed for a fine resolution frequency step while avoiding injection locking.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 2:
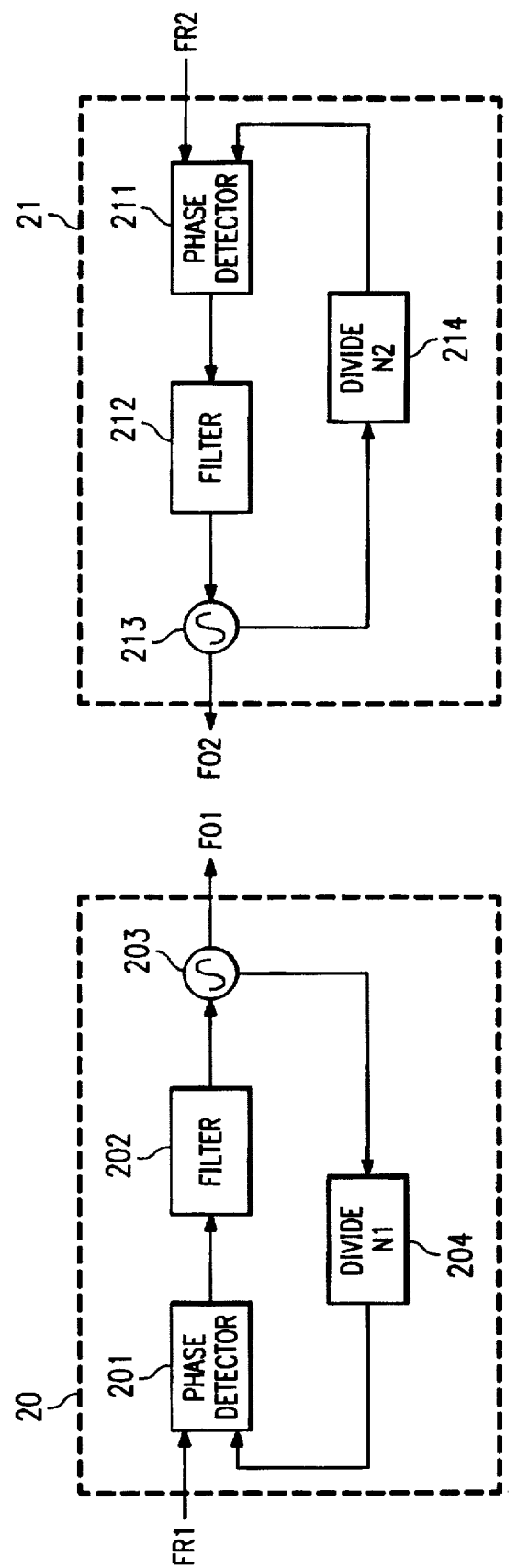
FIG. 2 shows a typical prior art PLL.

Prior to beginning a discussion of the operation of the invention, it might be best to review the prior art with respect to FIG. 2.

FIG. 2 shows the block diagram of a multiple PLL design used in prior art. Here both PLL's circuit 20 and 21, are identical to each other. The PLL's are constructed as feedback loops, circuit 20 consisting of a phase detector 201 connected to filter 202, which drives voltage controlled oscillator (VCO) 203 connected to divider N1 204, which is fed back to the phase detector 201. In response to a mismatch between the reference signal FR1, and the output of the divider, phase detector 201 generates an offset voltage at filter circuit 202. In response to this offset voltage, VCO 203 adjusts its output frequency such that when divided by the divide ratio N1, the signal is locked in phase and frequency to the reference input, FR1.

A concern of multiple PLL's existing on a common substrate is injection locking, whereby a PLL can lock to the frequency of a periodic injected signal. In the example of FIG. 2, injection locking could occur whereby circuit 20 could lock in frequency to the injected signal due to FO2 coupling through a common substrate. Similarly, injection locking could occur such that circuit 21 could lock in frequency to the injected signal due to FO1 coupling through a common substrate.

Figure 1:
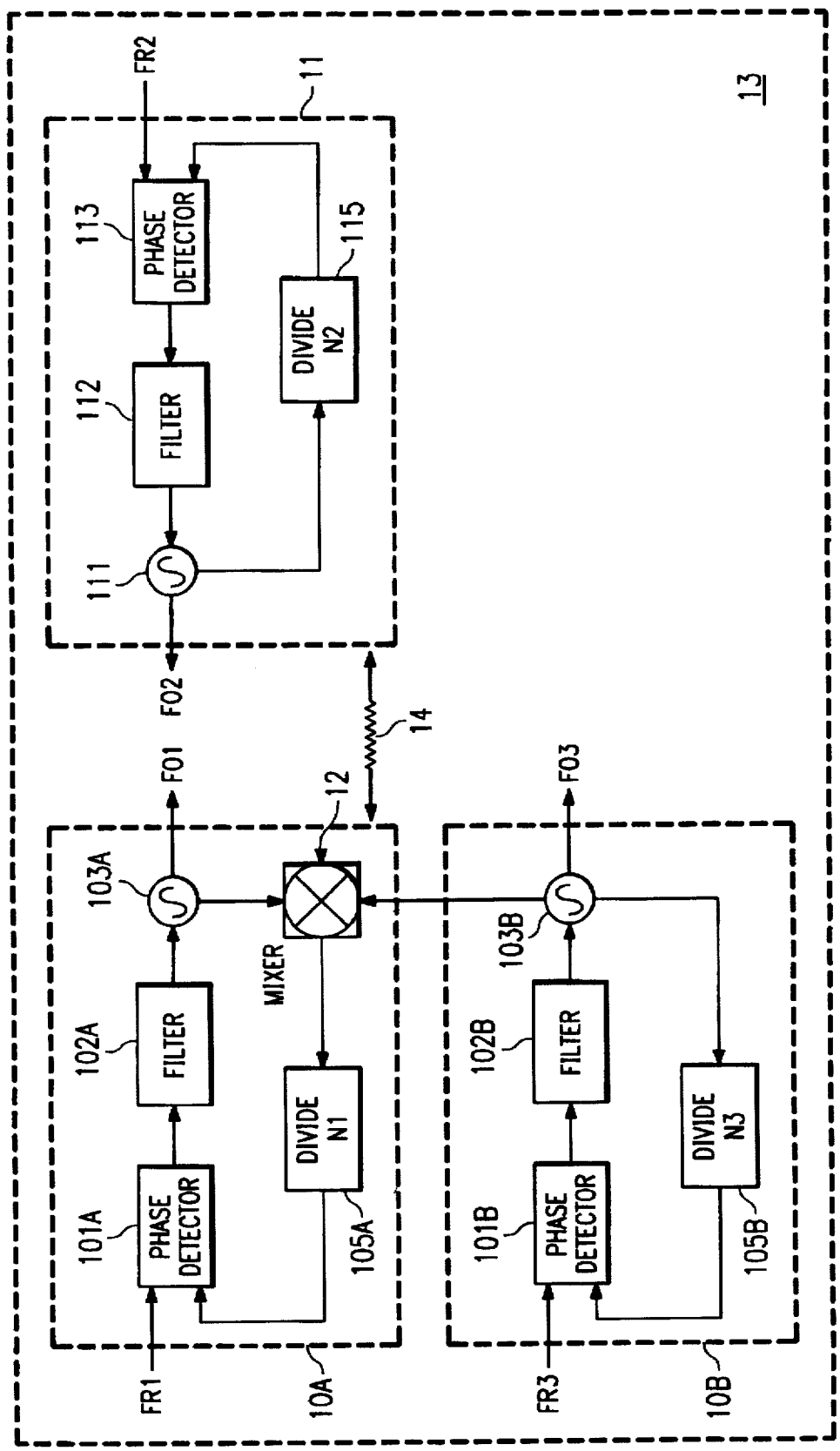
FIG. 1 shows an embodiment of the invention having multiple phase lock loops (PLLs) with one of the loops being a dual loop.

FIG. 1 shows the block diagram of one embodiment of the dual-loop synthesizer 10, showing two or more PLL's constructed on a common substrate 13. PLL 10A is used to provide a coarse resolution based on the input frequency FR1, and PLL 10B is used to provide a fine resolution based on the input frequency FR3. PLL 10B operates independently of PLL 10A, where the output of PLL 10B is applied as an input to mixer 12. The divide ratio of PLL 10B is N3 and is set by circuit 105B to provide an output frequency range greater than the resolution step of PLL 10A. This insures that the output of PLL 10A is able to lock at any fine resolution step based on PLL 10B within its coarse resolution step, defined by circuit 105A.

Mixer 12 is connected directly in the feedback path of PLL 10A. This forces output FO1 of voltage controlled oscillator VCO 103A to adjust its frequency for the difference frequency due to output frequency FO3 of VCO 103B. Thus, frequency FO1 now has a frequency resolution at its output based on the resolution of input frequency FR3, while maintaining a coarse reference frequency.

Based on the level of on-chip noise injection 14, the bandwidth of PLL 10A can be set to a large value to avoid injection locking from PLL 11. Similarly, the bandwidth of PLL 11 can be set to a large value to avoid injection locking from PLL 10A. The assumption being that FO1 and FO2 are both high frequencies close to each other in frequency.

By maintaining a coarse reference frequency FR1, the spurious modulation is significantly reduced at the output of PLL 10A. Also, the divide ratio N1 circuit 105A is reduced by the frequency range provided by PLL 10B. This reduces the gain required in the signal path from the phase detector to VCO 103A for PLL 10A. This is desirable as this reduces the phase noise at the VCO 103A output due to the reduced gain in this signal path.

The bandwidth of PLL 10B can be made significantly smaller than the bandwidth of PLL 10A while avoiding injection locking in PLL 10B. This is possible since the operating frequency of PLL 10B is much lower than in PLL 10A or in PLL 11.

Typically, N1 would be 6-bits wide or 64, N2 would be 6-bits wide or 64, and N3 would be 10-bits wide or 1024. Also, typically, FR1 would be 16 MHz, FR2 would be 16 MHz, FR3 would be 100 KHz, and FO1 would be 1.0 GHz, FO2 would be 1.0 GHz and FO3 would be 100 MHz.

Also, VCO 103B of PLL 10B can be made fully differential to provide rejection due to noise coupling, the rejection being much higher at the lower operating frequency of PLL 10B.

As shown, for injection locking to occur in PLL 10A it would have to lock to a sub-harmonic of the signals injected from PLL 10B and PLL 11. This, as is well-known, has a much smaller likelihood than locking to the injected signal itself.

While a dual-loop PLL has been shown and discussed herein, the same concept could be used for several loops, each having a different resolution.

Although the present invention and its advantages have been described in detail, it should be understood that various changes, substitutions and alterations can be made herein without departing from the spirit and scope of the invention as defined by the appended claims.

We claim:

1. An arrangement of a plurality of phase locked loops (PLLs), wherein at least one of the PLLs is arranged as a multi-looped PLL circuit, said arrangement comprising:

a common, monolithic substrate;

a first PLL is mounted on the common substrate and has a coarse resolution in relation to the input frequency to said first loop, wherein said first PLL includes an input for receiving a signal having a frequency with a variable phase, a first VCO output for providing a phase controlled frequency signal, a first feedback loop for providing at least a portion of said first VCO output signal back to the input of said first PLL and a first phase detector for comparing the phase of said input of said first PLL signal with the phase of said feedback loop signal, the output of said first PLL phase detector being provided to an input of said first VCO;

a second PLL is mounted on the common substrate and has a fine resolution in relation to the input frequency to said second loop, wherein said second PLL includes an input for receiving a signal having a frequency with a variable phase, a second VCO output for providing a phase controlled frequency signal, a feedback loop for providing at least a portion of said second VCO output signal back to the input of said second PLL and a second phase detector for comparing the phase of said second PLL input signal with the phase of said second PLL feedback loop signal, the output of said second PLL phase detector being provided to an input of said second VCO; and a mixer that is mounted on the common substrate and is connected in said first feedback loop, said mixer having inputs from the outputs of both said first PLL VCO and said second PLL VCO and an output that supplies a signal in the first feedback path, whereby injection locking is substantially eliminated.

2. The arrangement set forth in claim 1 wherein said second PLL VCO is fully differential.

3. The arrangement set forth in claim 1 wherein said first and second feedback loops each include a divide by N circuit, wherein the N for said second loop is set to provide an output frequency range greater than the resolution of said first PLL.

4. The arrangement set forth in claim 3 wherein a third PLL circuit mounted on said common substrate has a third feedback loop containing a divide by N circuit where N for both the first and third PLLs is 6-bits and the N for the second PLL is 10-bits.

5. The arrangement set forth in claim 1 wherein the bandwidth to avoid noise injection locking from a third PLL on said substrate is in the range of 1.0 MHz and wherein said first PLL has a bandwidth in the range of 1.0 MHz and wherein said second PLL has a bandwidth in the range of 10.0 KHz.

6. A method of operating a plurality of monolithic PLLs, said method comprising the steps of:

mounting the plurality of PLLs on a common, monolithic substrate;

applying a first signal to a first PLL of a multi-looped PLL;

phase adjusting said first signal as a result of a comparison against a controlled reference signal; and providing said phase adjusted input signal as a working phase controlled output signal; said controlled reference signal generated by the steps of:

mixing at least a portion of said output signal with at least a portion of an output signal generated by at least one other PLL circuit, said one other PLL having a free resolution bandwidth in comparison with the resolution bandwidth of said first PLL, whereby injection locking is substantially eliminated.

7. The method set forth in claim 6 where the resolution of said first PLL is in the range of 6-bits and wherein the resolution of said other PLL is in the range of 10-bits.

8. The method set forth in claim 6 wherein the bandwidth to avoid noise injection locking from another PLL on the common substrate is in the range of 1.0 MHz and wherein said first PLL has a bandwidth in the range of 1.0 MHz and wherein said second PLL has a bandwidth in the range of 10 KHz.

9. The arrangement set forth in claim 3 wherein the N for the first loop is 6-bits and the N for said second loop is 10-bits.

* * * * *